United States Patent
Kimura

(10) Patent No.: US 10,121,648 B2
(45) Date of Patent: Nov. 6, 2018

(54) SUBSTRATE PROCESSING METHOD AND SUBSTRATE PROCESSING APPARATUS

(71) Applicant: SCREEN Holdings Co., Ltd., Kyoto (JP)

(72) Inventor: Masahiro Kimura, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 317 days.

(21) Appl. No.: 14/854,428

(22) Filed: Sep. 15, 2015

(65) Prior Publication Data

US 2016/0089685 A1    Mar. 31, 2016

(30) Foreign Application Priority Data

Sep. 30, 2014  (JP) .................................. 2014-201719

(51) Int. Cl.
  *H01L 21/02* (2006.01)
  *H01L 21/306* (2006.01)

(52) U.S. Cl.
  CPC ...... *H01L 21/02082* (2013.01); *H01L 21/306* (2013.01)

(58) Field of Classification Search
  CPC combination set(s) only.
  See application file for complete search history.

(56) References Cited

U.S. PATENT DOCUMENTS

| | | | |
|---|---|---|---|
| 6,158,141 A | 12/2000 | Asada et al. | 34/74 |
| 6,770,151 B1 | 8/2004 | Ravkin et al. | 134/33 |
| 2007/0289611 A1 | 12/2007 | Hayashi | 134/26 |
| 2007/0295365 A1 | 12/2007 | Miya et al. | 134/26 |
| 2009/0311874 A1 | 12/2009 | Tomita et al. | 438/759 |
| 2010/0075504 A1 | 3/2010 | Tomita et al. | 438/706 |
| 2012/0045581 A1* | 2/2012 | Kimura | H01L 21/02057 427/248.1 |

FOREIGN PATENT DOCUMENTS

| | | |
|---|---|---|
| CN | 100490060 C | 5/2009 |
| CN | 100501921 C | 6/2009 |
| JP | 2010-114414 A | 5/2010 |
| JP | 2011-071169 A | 4/2011 |
| JP | 2012-44065 A | 3/2012 |
| JP | 2012-044144 | 3/2012 |
| JP | 2012-209299 A | 10/2012 |
| JP | 2013-157625 A | 8/2013 |
| KR | 10-2012-0022632 A | 3/2012 |

* cited by examiner

*Primary Examiner* — James Mellott
(74) *Attorney, Agent, or Firm* — Ostrolenk Faber LLP

(57) ABSTRACT

A maximum height, that corresponds to a width of a pattern formed on a front surface of a substrate to be processed, is searched among a plurality of maximum heights each being a maximum value of a height of a pattern having a particular width when pattern collapse does not occur. Thereafter, it is determined that whether or not a height of the pattern is greater than the maximum height. In a case where the height of the pattern is greater than the maximum height, a hydrophobizing agent is supplied to the substrate such that a hydrophobized region is formed on a whole tip-side region in a lateral surface of the pattern, and a non-hydrophobized region remains on at least a portion of a root-side region in the lateral surface of the pattern. Thereafter the substrate is dried.

18 Claims, 8 Drawing Sheets

FIG. 1

SUBSTRATE PROCESSING METHOD AND SUBSTRATE PROCESSING APPARATUS

BACKGROUND OF THE INVENTION

1. Field of the Invention

The present invention relates to a substrate processing apparatus and a substrate processing method for processing a substrate. Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

Japanese Patent Application Publication No. 2012-44144 discloses a method in which a substrate with a pattern formed on its front surface is supplied with a processing liquid such as a chemical and then dried. In this method, in order to dry the substrate while suppressing or preventing occurrence of pattern collapse, a chemical, pure water, a solvent, a hydrophobizing agent, and a solvent are supplied in this order to the substrate, and then, the substrate is dried. This publication describes that in a case where the front surface of the substrate is only partly hydrophobized, even when the substrate is hydrophobized and then dried, occurrence of pattern collapse cannot be suppressed.

The higher the aspect ratio of the pattern (height of the pattern/width of the pattern), the more easily pattern collapse occurs. To prevent a pattern from collapsing, there is a possible method in which the whole region of a lateral surface of the pattern is hydrophobized. However, in this method, a hydrophobizing agent needs to be sufficiently supplied up to the root of the pattern. In a case where a distance between two patterns adjacent to each other is small, an upper portion of a liquid between the two patterns is comparatively easily replaced with the hydrophobizing agent, however, it is not easy to replace a bottom portion of the liquid with the hydrophobizing agent. Therefore, to supply a hydrophobizing agent up to the root of the pattern, a supply flow rate of the hydrophobizing agent needs to be increased and a supply time of the hydrophobizing agent needs to be increased.

SUMMARY OF THE INVENTION

An object of the present invention is to dry a substrate while suppressing or preventing occurrence of pattern collapse and reduce at least one of a supply flow rate and a supply time of a hydrophobizing agent.

A preferred embodiment of the present invention provides a substrate processing method including a maximum height searching step of searching for a maximum height, that corresponds to a width of a pattern formed on a front surface of a substrate to be processed, among a plurality of maximum heights each being a maximum value of a height of a pattern having a particular width when pattern collapse does not occur, a height comparing step of determining whether or not a height of the pattern formed on the front surface of the substrate is greater than the maximum height found in the maximum height searching step, a hydrophobizing step of supplying, in a case where the height of the pattern is greater than the maximum height, a hydrophobizing agent to the substrate such that a hydrophobized region is formed on a whole tip-side region that is a region other than a root-side region from a root of the pattern to the maximum height in a lateral surface of the pattern, and a non-hydrophobized region remains on at least a portion of the root-side region in the lateral surface of the pattern, a pre-drying rinsing step of replacing the hydrophobizing agent held by the substrate with a solvent lower in surface tension than water by supplying the solvent to the substrate, after the hydrophobizing step, and a drying step of drying the substrate by removing the solvent held by the substrate, after the pre-drying rinsing step. The pattern may be a linear pattern or a cylindrical pattern. When the pattern is a cylindrical pattern, the width of the pattern means the thickness of the pattern. The height of the pattern is larger than the width of the pattern.

Pattern collapse easily occurs as a product (moment) of the "magnitude of a force generated at a border between a surface of a liquid and a lateral surface of a pattern" and the "distance from the border (point of effort) to a root (point of application) of the pattern" increases (refer to FIG. 7A). In a case where a substrate with a pattern formed on its front surface is dried, the surface of the liquid moves from a tip of the pattern to a root of the pattern. In a case where a height of the pattern is great, when the surface of the liquid is near the tip of the pattern, the distance from the point of effort to the point of application is large, so that a comparatively great moment is applied to the pattern. However, when the surface of the liquid moves to a position near the root of the pattern, the moment to be applied to the pattern becomes smaller. Therefore, in a case of hydrophobizing a lateral surface of a pattern, as long as a tip-side region on a tip-side beyond a certain predetermined height is hydrophobized, pattern collapse hardly occurs even if a root-side region from a root of the pattern to the height is not hydrophobized.

According to this method, with respect to a plurality of pattern widths different from each other, maximum values (maximum heights) of the pattern height when pattern collapse does not occur are measured in advance. When a width of a pattern formed on a front surface of a substrate to be processed is known, a corresponding maximum height is searched. Then, after a corresponding maximum height is found, whether or not the height of the pattern is greater than this maximum height is determined. When the height of the pattern is greater than the maximum height, a hydrophobizing agent that hydrophobizes the substrate is supplied to the substrate. Accordingly, a hydrophobized region is formed on a whole tip-side region on a tip-side of the pattern beyond the maximum height in a lateral surface of the pattern, and a non-hydrophobized region remains on a portion or a whole of a root-side region from the root of the pattern to the maximum height in the lateral surface of the pattern. That is, although the tip-side region is hydrophobized, the root-side region is not hydrophobized or only partly hydrophobized.

After a hydrophobizing agent is supplied to the substrate, a solvent lower in surface tension than water is supplied to the substrate, and the hydrophobizing agent held by the substrate is replaced with the solvent. Thereafter, the solvent is removed from the substrate and the substrate is dried. At this time, the liquid surface of the solvent moves from the tip of the pattern toward the root of the pattern. As aforementioned, since the tip-side region is hydrophobized, when a border between the surface of the solvent and the lateral surface of the pattern is in this region, a force that is generated at this border is small, and pattern collapse hardly occurs. Although the root-side region is not sufficiently hydrophobized, when the border between the surface of the solvent and the lateral surface of the pattern is in this region, the distance from the point of effort (the border) to the point of application (root of the pattern) is small, so that the moment to be applied to the pattern is small. Therefore, pattern collapse hardly occurs.

Thus, in this method, since the whole tip-side region on the tip-side of the pattern beyond the maximum height in a lateral surface of the pattern is hydrophobized, occurrence of pattern collapse can be suppressed or prevented. Further, since a non-hydrophobized region remains in the root-side region from the root to the maximum height of the pattern in the lateral surface of the pattern, at least one of the supply flow rate and the supply time of the hydrophobizing agent can be reduced as compared with the case where the whole region of the lateral surface of the pattern is hydrophobized. Accordingly, the substrate can be dried while occurrence of pattern collapse is suppressed or prevented, and at least one of the supply flow rate and the supply time of the hydrophobizing agent can be reduced.

The above-described substrate processing method may further include a heating step of heating the solvent held by the substrate, in parallel to the pre-drying rinsing step.

According to this method, a hydrophobizing agent and a solvent are supplied in this order to the substrate, and the solvent held by the substrate is heated. Since the temperature of the solvent rises due to heating, the hydrophobizing agent can be efficiently replaced with the solvent, and the time to replace the hydrophobizing agent with the solvent can be shortened. Further, vaporization of the solvent is promoted during drying of the substrate, and the substrate drying time is shortened. Further, since vaporization of the solvent is promoted, the film thickness of the solvent before drying of the substrate is started decreases. Accordingly, since the amount of the solvent that should be removed from the substrate decreases, the substrate drying time can be further shortened. In addition, since the surface tension of the solvent decreases due to the temperature rise, a force to be applied to the pattern during drying of the substrate can be further reduced.

The hydrophobizing step may include a step of making, in a case where the height of the pattern is greater than the maximum height, at least one of a supply flow rate and a supply time of the hydrophobizing agent to be supplied to the substrate smaller than a supply flow rate and a supply time of the hydrophobizing agent at which the hydrophobized region is formed on the whole region of the lateral surface of the pattern.

According to this method, a supply flow rate and a supply time of the hydrophobizing agent at which the hydrophobized region is formed on the whole region of the lateral surface of the pattern are measured in advance. When the height of the pattern is greater than the maximum height, at least one of a supply flow rate and a supply time of the hydrophobizing agent are made smaller than a supply flow rate and a supply time of the hydrophobizing agent which are measured in advance. Normally, a liquid between two patterns adjacent to each other is replaced with the hydrophobizing agent from the upper portion of the liquid. Therefore, when at least one of the supply flow rate and the supply time is made smaller, while a hydrophobized region is formed on a tip-side portion of the lateral surface of the pattern, a non-hydrophobized region remains on the root-side portion of the lateral surface of the pattern. Accordingly, at least one of the supply flow rate and the supply time of the hydrophobizing agent can be reduced while occurrence of pattern collapse is suppressed or prevented.

The hydrophobizing step may include a step of supplying, in a case where the pattern is a laminated film and the height of the pattern is greater than the maximum height, the substrate with a hydrophobizing agent that hydrophobizes at least one film constituting the tip-side region in the lateral surface of the pattern.

An example in which the pattern has a three-layer structure is described below. In a case where an upper layer film, an intermediate layer film, and a lower layer film of the pattern are an Si-containing film, an Si-containing film, and a metal film, respectively, and the maximum height is within the range of the intermediate layer film (refer to FIG. 10), a silicon hydrophobizing agent that hydrophobizes silicon itself and a compound containing silicon is supplied to the substrate, and the upper layer film and the intermediate layer film are hydrophobized.

In a case where the upper layer film, the intermediate layer film, and the lower layer film of the pattern are a metal film, an Si-containing film, and an Si-containing film, respectively, and the maximum height is within the range of the intermediate layer film (refer to FIG. 11), a silicon hydrophobizing agent is supplied to the substrate at a predetermined supply flow rate for a predetermined supply time such that a non-hydrophobized region remains on at least a portion of a root-side region from the root to the maximum height of the pattern in a lateral surface of the pattern, and the intermediate layer film is hydrophobized. Thereafter, a metal hydrophobizing agent that hydrophobizes a metal itself and a compound containing metal is supplied to the substrate, and the upper layer film is hydrophobized.

Thus, according to this method, the kind of the hydrophobizing agent is selected according to the kind of a film constituting the pattern, and the selected kind of hydrophobizing agent is supplied to the substrate. Accordingly, while a hydrophobized region is formed on a tip-side portion of a lateral surface of the pattern, a non-hydrophobized region remains on a root-side portion of the lateral surface of the pattern. Therefore, at least one of the supply flow rate and the supply time of the hydrophobizing agent can be reduced while occurrence of pattern collapse is suppressed or prevented.

The substrate processing method may include a non-contacting step of maintaining a state where water does not contact the substrate during a period from an end of the hydrophobizing step to an end of the drying step.

According to this method, during a period from an end of supply of the hydrophobizing agent to an end of drying of the substrate, water (liquid containing water as a main component such as pure water) is not supplied to the substrate. Therefore, during this period, a state where water does not contact the substrate is maintained. When water comes into contact with the substrate hydrophobized by a hydrophobizing agent (metal hydrophobizing agent) that hydrophobizes a metal film, the hydrophobic property of the substrate may significantly deteriorate. Therefore, even in the case where such a hydrophobizing agent is supplied to the substrate, the hydrophobic property of the substrate can be prevented from significantly deteriorating. Accordingly, occurrence of pattern collapse can be suppressed or prevented.

The pre-drying rinsing step may be a step of supplying the solvent at a temperature higher than a room temperature to the substrate.

In this case, a solvent at a temperature higher than a room temperature is supplied to the substrate after the hydrophobizing agent is supplied to the substrate. Since the temperature of the solvent is higher than a room temperature, the hydrophobizing agent can be efficiently replaced with the solvent, and the time to replace the hydrophobizing agent with the solvent can be shortened. Further, vaporization of the solvent is promoted during drying of the substrate, and the substrate drying time is shortened. Further, since vaporization of the solvent is promoted, the film thickness of the solvent before drying of the substrate is started decreases. Accordingly, the amount of the solvent that should be removed from the substrate decreases, the substrate drying time can be further shortened. In addition, since the surface tension of the solvent decreases due to the temperature rise, a force to be applied to the pattern during drying of the substrate can be further reduced.

Another preferred embodiment of the present invention provides a substrate processing method including a step of identifying a pattern height with which pattern collapse does not occur in a width of a pattern formed on a front surface of a substrate to be processed, a hydrophobizing step of supplying a hydrophobizing agent to the substrate such that a hydrophobized region is formed on a whole tip-side region that is a region other than a root-side region from a root of the pattern to the maximum height in a lateral surface of the pattern and a non-hydrophobized region remains on at least a portion of the root-side region in the lateral surface of the pattern, a pre-drying rinsing step of replacing the hydrophobizing agent held by the substrate with a solvent lower in surface tension than water by supplying the solvent to the substrate, after the hydrophobizing step, and a drying step of drying the substrate by removing the solvent held by the substrate, after the pre-drying rinsing step. The pattern height may not be a maximum value of the height of the pattern when pattern collapse does not occur. That is, the pattern height may be equal to the maximum height, or may be different from the maximum height.

The pattern may be a laminated pattern (for example, a pattern having a three-layer structure) including an upper layer film, an intermediate layer film, and a lower layer film. The step of identifying the pattern height may be a step of identifying a height of the intermediate layer film (for example, a height of a lowermost portion of the intermediate layer film) as the pattern height. The hydrophobizing step may be a step of supplying the hydrophobizing agent to the substrate such that a hydrophobized region is formed on lateral surfaces of the upper layer film and the intermediate layer film, and a non-hydrophobized region remains on at least a portion of a lateral surface of the lower layer film.

Still another preferred embodiment of the present invention provides a substrate processing apparatus including a substrate holding unit that holds a substrate, a hydrophobizing agent supplying unit that supplies a hydrophobizing agent to the substrate held by the substrate holding unit, a solvent supplying unit that supplies a solvent lower in surface tension than water to the substrate held by the substrate holding unit, a drying unit that dries the substrate held by the substrate holding unit by removing a liquid from the substrate, and a controller that includes a storage portion that stores a plurality of maximum heights each being a maximum value of a height of a pattern having a particular width when pattern collapse does not occur, a maximum height searching portion that searches for a maximum height, that corresponds to a width of a pattern formed on a front surface of the substrate held by the substrate holding unit, among the plurality of maximum heights stored in the storage portion, and a height comparing portion that determines whether or not a height of the pattern formed on the front surface of the substrate is greater than the maximum value found by the maximum height searching portion, and controls the hydrophobizing agent supplying unit, the solvent supplying unit, and the drying unit.

The controller executes a maximum height searching step of searching for the maximum height, that corresponds to the width of the pattern formed on the front surface of the substrate held by the substrate holding unit, among the plurality of the maximum heights stored in the storage portion, a height comparing step of determining whether or not the height of the pattern formed on the front surface of the substrate is greater than the maximum height found in the maximum height searching step, a hydrophobizing step of supplying, in a case where the height of the pattern is greater than the maximum height, the hydrophobizing agent to the substrate such that a hydrophobized region is formed on a whole tip-side region that is a region other than a root-side region from a root of the pattern to the maximum height in a lateral surface of the pattern, and a non-hydrophobized region remains on at least a portion of the root-side region in the lateral surface of the pattern, a pre-drying rinsing step of replacing the hydrophobizing agent held by the substrate with the solvent lower in surface tension than water by supplying the solvent to the substrate, after the hydrophobizing step, and a drying step of drying the substrate by removing the solvent held by the substrate, after the pre-drying rinsing step. With this arrangement, the same effect as described above can be obtained.

The substrate processing apparatus may further include a heating unit that heats a liquid held by the substrate. The controller may further execute a heating step of causing the heating unit to heat the solvent held by the substrate, in parallel to the pre-drying rinsing step. With this arrangement, the same effect as described above can be obtained.

The aforementioned and other objects, features, and effects of the present invention shall be clarified by the following description of preferred embodiments with reference to the accompanying drawings.

BRIEF DESCRIPTION OF THE DRAWINGS

FIG. 1 is a horizontal schematic view of the interior of a processing unit included in a substrate processing apparatus according to a preferred embodiment of the present invention, showing a state where a chemical nozzle is at a processing position, and a shield plate is at a waiting position.

DETAILED DESCRIPTION OF THE PREFERRED EMBODIMENTS

Figure 1:
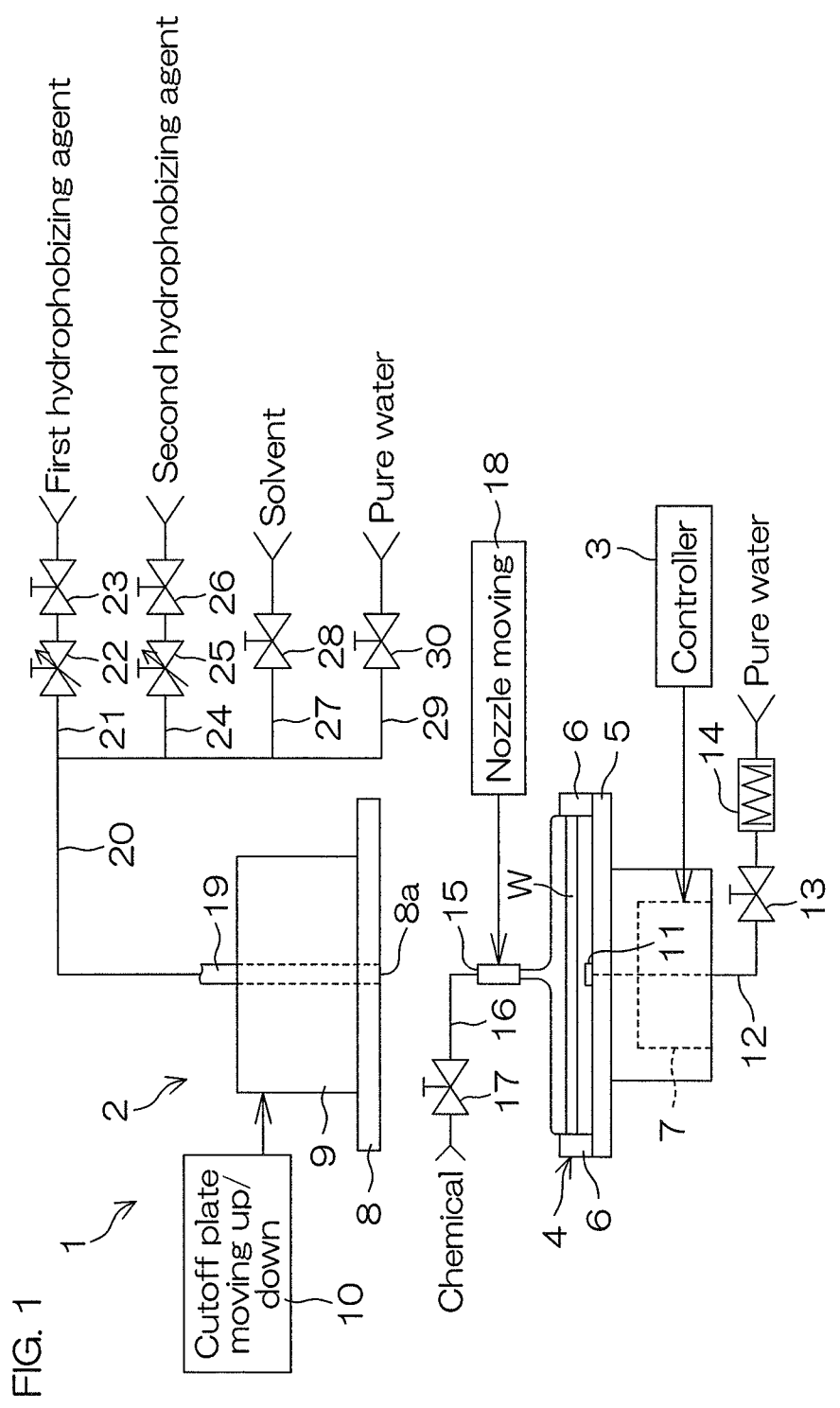
Figure 2:
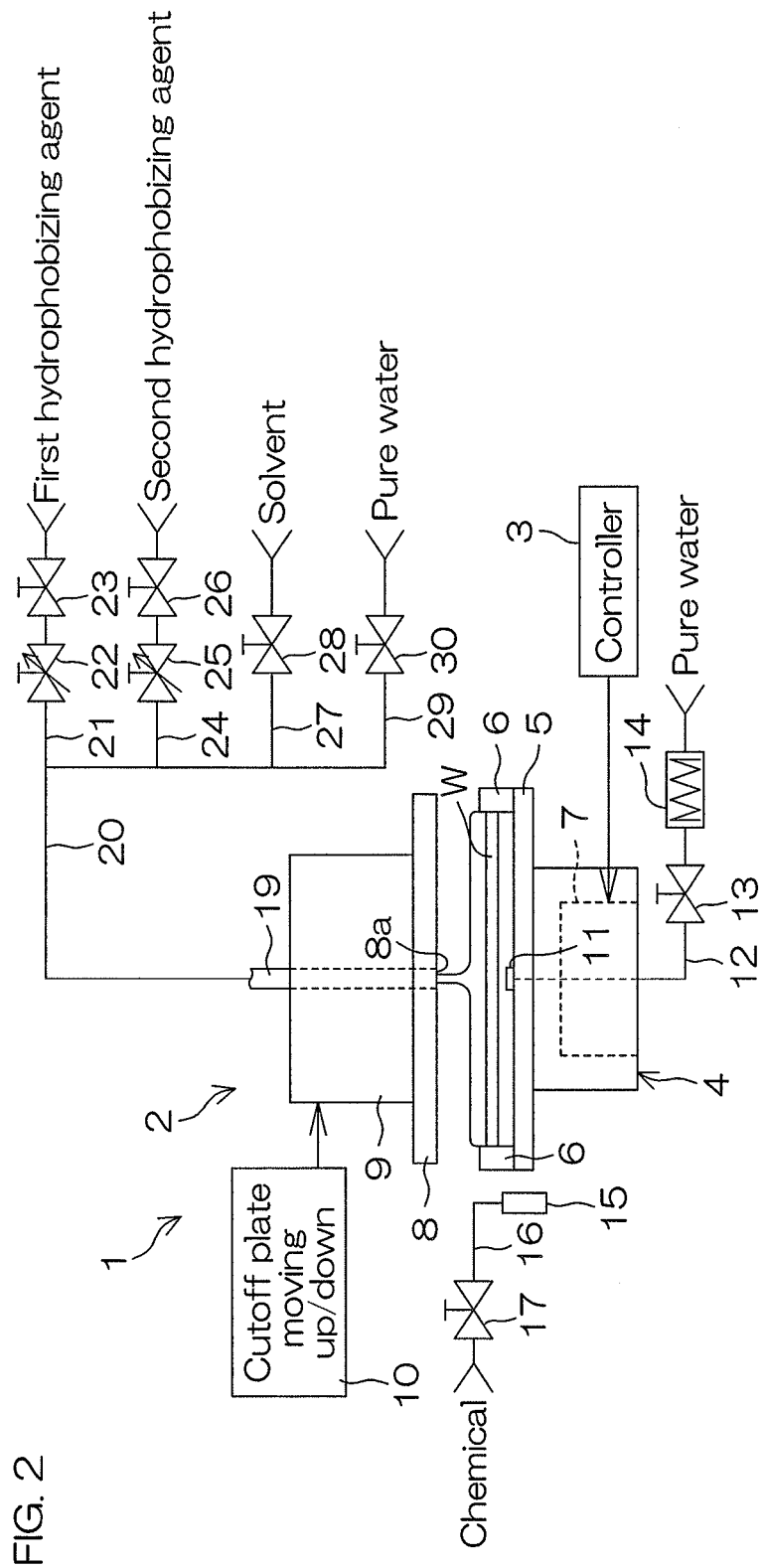
FIG. 2 is a horizontal schematic view of the interior of the processing unit, showing a state where the chemical nozzle is at a waiting position, and the shield plate is at a processing position.

FIG. 1 and FIG. 2 are horizontal schematic views of the interior of a processing unit 2 included in a substrate processing apparatus 1 according to a preferred embodiment of the present invention. FIG. 1 shows a state where a chemical nozzle 15 is at a processing position and a shield plate 8 is at a waiting position. FIG. 2 shows a state where a chemical nozzle 15 is at a waiting position and a shield plate 8 is at a processing position.

The substrate processing apparatus 1 is a single substrate processing type apparatus that processes disk-shaped substrates W such as semiconductor wafers one by one. The substrate processing apparatus 1 includes a processing unit 2 that processes a substrate W by using a processing liquid, a transfer robot (not shown) that transfers a substrate W to the processing unit 2, and a controller 3 that controls the substrate processing apparatus 1.

The processing unit 2 includes a spin chuck 4 that rotates a substrate W around a vertical rotation axis passing through the central portion of the substrate W while holding the substrate W horizontally, a disk-shaped shield plate 8 disposed in a horizontal posture above the spin chuck 4, a plurality of nozzles that discharge a processing liquid toward the substrate W held by the spin chuck 4, and a box-shaped chamber (not shown) that houses the spin chuck 4, etc.

The spin chuck 4 includes a disk-shaped spin base 5 held in a horizontal posture, a plurality of chuck pins 6 that hold a substrate W in a horizontal posture above the spin base 5, and a spin motor 7 that rotates the substrate W around the rotation axis by rotating the spin base 5. The spin chuck 4 is not limited to a clamping type chuck that brings the plurality of chuck pins 6 into contact with the peripheral end face of the substrate W, but may be a vacuum type chuck that holds a substrate W horizontally by adsorbing the rear surface (lower surface) defining a non-device forming surface of the substrate W onto the upper surface of the spin base 5.

The shield plate 8 is supported in a horizontal posture by a support shaft 9. The support shaft 9 extends upward from the shield plate 8. The support shaft 9 is supported by a support arm (not shown) extending horizontally at a position higher than the shield plate 8. The centerline of the shield plate 8 is disposed on the rotation axis of the substrate W. The outer diameter of the shield plate 8 is equal to or larger than the outer diameter of the substrate W. The shield plate 8 includes a horizontal circular lower surface and a downward discharge port 8a opened at the lower surface central portion of the shield plate 8. The lower surface of the shield plate 8 faces the upper surface of the substrate W held by the spin chuck 4.

The processing unit 2 includes a shield plate raising/lowering unit 10 that moves up and down the shield plate 8 in the vertical direction between a processing position (position shown in FIG. 2) and a waiting position (position shown in FIG. 1). The processing position is a close position at which the lower surface of the shield plate 8 comes close to the upper surface of the substrate W to a height that does not allow the chemical nozzle 15 to enter a portion between the substrate W and the shield plate 8. The waiting position is a retracted position at which the shield plate 8 is retracted to a height that allows the chemical nozzle 15 to enter a portion between the shield plate 8 and the substrate W. The shield plate raising/lowering unit 10 can position the shield plate 8 at arbitrary positions (heights) between the processing position and the waiting position.

The processing unit 2 includes a heating nozzle 11 that discharges a heating liquid at a temperature higher than a room temperature (for example, 20 to 30° C.) toward the lower surface central portion of the substrate W, a heating piping 12 that guides the heating liquid to the heating nozzle 11, a heating valve 13 interposed in the heating piping 12, and a heater 14 that heats the heating liquid to be supplied from the heating piping 12 to the heating nozzle 11 at a temperature higher than the room temperature.

In a state where the substrate W is held by the spin chuck 4, the discharge port of the heating nozzle 11 faces the lower surface central portion of the substrate W in the up-down direction. In this state, when the heating valve 13 is opened, the heating liquid heated by the heater 14 is discharged from the discharge port of the heating nozzle 11 toward the lower surface central portion of the substrate W. The heating liquid is, for example, hot water (heated pure water), and the temperature of the hot water when it is discharged from the heating nozzle 11 is equal to or higher than 50° C. (for example, 80° C.). The heating liquid is not limited to pure water, but may be carbonated water, electrolyzed ion water, hydrogen water, ozone water, IPA (isopropyl alcohol), or hydrochloric acid water at a dilution concentration (for example, approximately 10 to 100 ppm), etc.

The processing unit 2 includes the chemical nozzle 15 that discharges a chemical downward, a chemical piping 16 that guides the chemical to the chemical nozzle 15, a chemical valve 17 interposed in the chemical piping 16, a nozzle arm (not shown) having a tip portion to which the chemical nozzle 15 is attached, and a nozzle moving unit 18 that moves the chemical nozzle 15 by moving the nozzle arm horizontally. The nozzle moving unit 18 moves the chemical nozzle 15 horizontally along an arc-shaped path passing through the central portion of the substrate W in a plan view. The nozzle moving unit 18 moves the chemical nozzle 15 between a processing position (position shown in FIG. 1) at which the chemical nozzle 15 is positioned above the substrate W, and a waiting position (position shown in FIG. 2) at which the chemical nozzle 15 is retracted so as not to overlap the substrate W in a plan view.

The processing unit 2 includes a central nozzle 19 that discharges a processing liquid downward toward the upper surface central portion of the substrate W, and a processing liquid piping 20 that guides the processing liquid to the central nozzle 19. The processing unit 2 further includes a solvent piping 27 that guides a solvent (liquid) to the processing liquid piping 20, a solvent valve 28 interposed in the solvent piping 27, a rinse liquid piping 29 that guides a rinse liquid to the processing liquid piping 20, and a rinse liquid valve 30 interposed in the rinse liquid piping 29.

The processing unit 2 further includes a first hydrophobizing agent piping 21 that guides a first hydrophobizing agent (liquid) to the processing liquid piping 20, a first flow rate regulating valve 22 that changes a supply flow rate of the first hydrophobizing agent to be supplied from the first hydrophobizing agent piping 21 to the processing liquid piping 20, a first hydrophobizing agent valve 23 interposed in the first hydrophobizing agent piping 21, a second hydrophobizing agent piping 24 that guides a second hydrophobizing agent (liquid) to the processing liquid piping 20, a second flow rate regulating valve 25 that changes a supply flow rate of the second hydrophobizing agent to be supplied from the second hydrophobizing agent piping 24 to the processing liquid piping 20, and a second hydrophobizing agent valve 26 interposed in the second hydrophobizing agent piping 24.

The discharge port of the central nozzle 19 is disposed above the downward discharge port 8a opened at the lower surface central portion of the shield plate 8. The central nozzle 19 moves up/down together with the shield plate 8 and the support shaft 9. When the first hydrophobizing agent valve 23 is opened, the first hydrophobizing agent inside the first hydrophobizing agent piping 21 is supplied to the central nozzle 19 via the processing liquid piping 20 at a flow rate corresponding to an opening degree of the first flow rate regulating valve 22. Similarly, when any of the second hydrophobizing agent valve 26, the solvent valve 28, and the rinse liquid valve 30 is opened, any of the second hydrophobizing agent, the solvent, and the rinse liquid is supplied to the central nozzle 19 via the processing liquid piping 20. Accordingly, the first hydrophobizing agent, the second hydrophobizing agent, the solvent, and the rinse liquid are selectively discharged from the central nozzle 19.

"Rinse liquid" is a liquid including water. The rinse liquid is, for example, pure water (deionized water). The rinse liquid is not limited to pure water, but may be any of carbonated water, electrolyzed ion water, hydrogen water, ozone water, and hydrochloric acid water at a dilution concentration (for example, approximately 10 to 100 ppm), etc.

"Solvent" is a liquid that can dissolve hydrophobizing agents and water and hardly contains water. The solvent includes, for example, at least one of alcohol, PGMEA (propylene glycol monomethylether acetate), EGMEA (ethylene glycol monomethylether), and a fluorine-based solvent. The solvent has surface tension smaller than that of water and a boiling point lower than that of water.

Alcohol includes at least one of, for example, methanol, ethanol, propyl alcohol, and IPA (isopropyl alcohol).

Ketone includes at least one of, for example, acetone and diethyl ketone.

The fluorine-based solvent includes at least one of, for example, HFE (hydrofluoroether) and HFC (hydrofluorocarbon).

The "first hydrophobizing agent" and the "second hydrophobizing agent" are hydrophobizing agents of kinds different from each other. The first hydrophobizing agent and the second hydrophobizing agent are liquids hardly containing water. The first hydrophobizing agent is, for example, a silicon hydrophobizing agent that hydrophobizes silicon itself and a compound containing silicon, or a metal hydrophobizing agent that hydrophobizes a metal itself and a compound containing a metal. The same applies to the second hydrophobizing agent.

The silicon hydrophobizing agent is, for example, a silane coupling agent. The silane coupling agent includes at least one of, for example, HMDS (hexamethyldisilazane), TMS (tetramethylsilane), fluorinated alkylchlorosilane, and alkyldisilazane.

The metal hydrophobizing agent is, for example, a non-silane coupling agent. The non-silane coupling agent is, for example, a hydrophobizing agent with high coordination property.

The first hydrophobizing agent may be a hydrophobizing agent diluted with a diluting solvent, or may be an undiluted solution of a hydrophobizing agent that is not diluted with a diluting solvent. The same applies to the second hydrophobizing agent.

The "diluting solvent" is a liquid that can dissolve the above-described hydrophobizing agents and solvents and water and hardly contains water. The diluting solvent includes at least one of, for example, alcohol (monovalent alcohol), polyalcohol, ketone, PGMEA, EGMEA, and a fluorine-based solvent. The diluting solvent has surface tension smaller than that of water and a boiling point lower than that of water.

Alcohol includes at least one of, for example, methanol, ethanol, propyl alcohol, and IPA.

Polyalcohol includes, for example, ethylene glycol.

Ketone includes at least one of, for example, acetone and diethyl ketone.

The fluorine-based solvent includes at least one of, for example, HFE and HFC.

Figure 3:
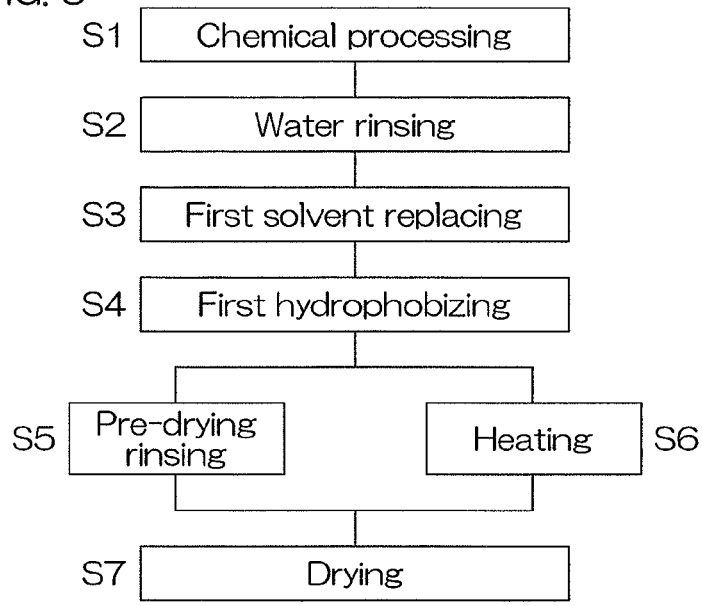
FIG. 3 is a process flowchart for describing a first processing example to be executed by the substrate processing apparatus.

FIG. 3 is a process flowchart for describing a first processing example to be executed by the substrate processing apparatus 1. Hereinafter, a processing example when processing a substrate W having a pattern (refer to FIG. 7A and FIG. 7B) formed on a front surface defining a device forming surface is described. The pattern may be a linear pattern or may be a cylindrical pattern. The "upper surface (front surface) of the substrate W" includes the upper surface (front surface) of the substrate W itself and the surface of the pattern. The steps described below are executed by controlling the substrate processing apparatus 1 by the controller 3 according to a recipe 33 (refer to FIG. 5).

When the substrate W is processed by the processing unit 2, a carrying-in step of carrying the substrate W into the chamber is executed.

In detail, in a state where the shield plate 8 and the chemical nozzle 15 are at their waiting positions, the controller 3 causes a hand, holding the substrate W, of a transfer robot (not shown) to enter the inside of the chamber. Thereafter, the controller 3 causes the transfer robot to place the substrate W on the spin chuck 4 in a state where the front surface being a device forming surface is directed upward, and causes the spin chuck 4 to hold the substrate W. Subsequently, the controller 3 causes the hand of the transfer robot to be retracted from the inside of the chamber. Thereafter, the controller 3 causes the spin chuck 4 to start to rotate the substrate W.

Next, a chemical processing step of supplying a chemical to the upper surface of the substrate W is executed (Step S1 in FIG. 3).

In detail, the controller 3 causes the chemical nozzle 15 to move from the waiting position to the processing position in a state where the shield plate 8 is at the waiting position by controlling the nozzle moving unit 18. Thereafter, the controller 3 opens the chemical valve 17 and causes the chemical nozzle 15 to discharge the chemical toward an upper surface central portion of the substrate W being rotated. The chemical discharged from the chemical nozzle 15 flows outward along the upper surface of the substrate W. At this time, the controller 3 may move a chemical contact position on the upper surface of the substrate W between the central portion and a peripheral edge portion by causing the nozzle moving unit 18 to move the chemical nozzle 15. Thus, a liquid film of the chemical covering the whole region of the upper surface of the substrate W is formed, and the substrate W is processed with the chemical. When a predetermined time elapses after the chemical valve 17 is opened, the controller 3 closes the chemical valve 17 to stop discharge of the chemical. Thereafter, the controller 3 causes the chemical nozzle 15 to move to the waiting position by controlling the nozzle moving unit 18.

Next, a water rinsing step of supplying pure water as an example of the rinse liquid to the upper surface of the substrate W is executed (Step S2 in FIG. 3).

In detail, the controller 3 causes the shield plate 8 to move from the waiting position to the processing position in a state where the chemical nozzle 15 is at the waiting position by controlling the shield plate raising/lowering unit 10. Thereafter, the controller 3 opens the rinse liquid valve 30 and causes the central nozzle 19 to discharge pure water toward the upper surface central portion of the substrate W being rotated. Accordingly, the liquid film of the chemical is replaced with a liquid film of pure water covering the whole region of the upper surface of the substrate W, and the chemical on the substrate W is rinsed away with pure water. When a predetermined time elapses after the rinse liquid valve 30 is opened, the controller 3 closes the rinse liquid valve 30 to stop discharge of pure water.

Next, a first solvent replacing step of supplying a solvent (liquid) to the upper surface of the substrate W is executed (Step S3 in FIG. 3).

In detail, in a state where the shield plate 8 is at the waiting position, the controller 3 opens the solvent valve 28 and causes the central nozzle 19 to discharge the solvent toward the upper surface central portion of the substrate W being rotated. Accordingly, the solvent as a first solvent is supplied to the whole region of the upper surface of the substrate W. The solvent is a liquid that can dissolve water, so that a portion of pure water on the substrate W is pushed out to the surrounding area of the substrate W by the solvent supplied to the substrate W, and the remaining pure water dissolves in the solvent supplied to the substrate W. The solvent in which pure water dissolved is pushed out to the surrounding area of the substrate W by the solvent supplied subsequently to the substrate W. Therefore, by continuing supply of the solvent, all or almost all of the pure water is removed from the substrate W, and the liquid film of the pure water is replaced with the liquid film of the solvent covering the whole region of the upper surface of the substrate W. When a predetermined time elapses after the solvent valve 28 is opened, the controller 3 closes the solvent valve 28 to stop discharge of the solvent.

Next, a first hydrophobizing step of supplying a hydrophobizing agent (liquid) to the upper surface of the substrate W is executed (Step S4 in FIG. 3).

In detail, in a state where the shield plate 8 is at the processing position, the controller 3 opens the hydrophobizing agent valve (the first hydrophobizing agent valve 23 or the second hydrophobizing agent valve 26) and causes the central nozzle 19 to discharge a hydrophobizing agent toward the upper surface central portion of the substrate W being rotated. Accordingly, the hydrophobizing agent is supplied to the whole region of the upper surface of the substrate W. Since the solvent on the substrate W is a liquid that can dissolve the hydrophobizing agent, by continuing supply of the hydrophobizing agent, all or almost all of the solvent is removed from the substrate W, and the liquid film of the solvent is replaced with a liquid film of the hydrophobizing agent covering the whole region of the upper surface of the substrate W. Accordingly, the hydrophobizing agent enters the inside of the pattern, and the upper surface of the substrate W is hydrophobized. When a predetermined time elapses after the hydrophobizing agent valve is opened, the controller 3 closes the hydrophobizing agent valve to stop discharge of the hydrophobizing agent.

Next, a pre-drying rinsing step (Step S5 in FIG. 3) of supplying a solvent (liquid) at a room temperature to the upper surface of the substrate W, and a heating step (Step S6 in FIG. 3) of heating the solvent on the substrate W by supplying hot water as an example of a heating liquid at a temperature higher than the room temperature to the lower surface of the substrate W, are executed in parallel.

In the pre-drying rinsing step, in a state where the shield plate 8 is at the processing position, the controller 3 opens the solvent valve 28 and causes the central nozzle 19 to discharge the solvent at the room temperature toward the upper surface central portion of the substrate W being rotated. Accordingly, the solvent is supplied to the whole region of the upper surface of the substrate W. Therefore, all or almost all of the hydrophobizing agent is removed from the substrate W, and the liquid film of the hydrophobizing agent is replaced with a liquid film of the solvent covering the whole region of the upper surface of the substrate W. When a predetermined time elapses after the solvent valve 28 is opened, the controller 3 closes the solvent valve 28 to stop discharge of the solvent.

In the heating step, the controller 3 opens the heating valve 13 and causes the heating nozzle 11 to discharge hot water toward a lower surface central portion of the substrate W being rotated. The hot water discharged from the heating nozzle 11 comes into contact with the lower surface central portion of the substrate W, and then flows outward along the lower surface of the substrate W. Accordingly, the hot water is supplied to the whole region of the lower surface of the substrate W. Therefore, the whole region of the substrate W is heated by the hot water, and the solvent on the substrate W is heated by the substrate W. When a predetermined time elapses after the heating valve 13 is opened, the controller 3 closes the heating valve 13 to stop discharge of the hot water from the heating nozzle 11.

The time for the heating nozzle 11 to start discharge of hot water may be the same as or before or after the time for the central nozzle 19 to start discharge of the solvent. Similarly, the time for the heating nozzle 11 to end discharge of hot water may be the same as or before or after the time for the central nozzle 19 to end discharge of the solvent. That is, as long as the heating nozzle 11 discharges hot water in at least a portion of a period during which the central nozzle 19 discharges the solvent, the times to start and end discharge of hot water may be any time. For example, over an entire period during which the central nozzle 19 discharges the solvent, the heating nozzle 11 may discharge hot water.

After the pre-drying rinsing step and the heating step are executed, a drying step of drying the substrate W is executed (Step S7 in FIG. 3).

In detail, by controlling the spin motor 7, the controller 3 rotates the substrate W at a high rotation speed (for example, several thousands of rpm) in a state where the shield plate 8 is at the processing position. Accordingly, a great centrifugal force is applied to the solvent attached to the substrate W, and the solvent is shaken off from the substrate W to the surrounding area. Therefore, the solvent is removed from the substrate W, and the substrate W is dried. When a predetermined time elapses after the high-speed rotation of the substrate W is started, the controller 3 causes the spin motor 7 to stop rotation of the substrate W.

Next, a taking-out step of taking the substrate W out from the chamber is executed.

In detail, the controller 3 causes the spin chuck 4 to release holding of the substrate W. Further, by controlling the shield plate raising/lowering unit 10, the controller 3 causes the shield plate 8 to move from the processing position to the waiting position. Thereafter, the controller 3 causes the hand of the transfer robot to enter the inside of the chamber and support the substrate W on the spin chuck 4. Thereafter, the controller 3 causes the hand of the transfer robot to withdraw from the inside of the chamber. Accordingly, the processed substrate W is taken out from the chamber.

Figure 4:
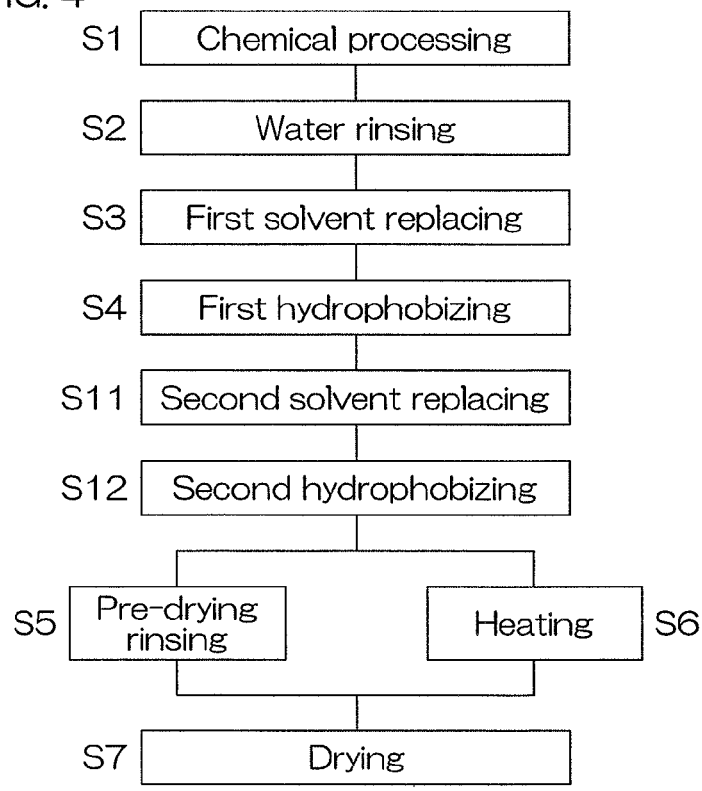
FIG. 4 is a process flowchart for describing a second processing example to be executed by the substrate processing apparatus.

FIG. 4 is a process flowchart for describing a second processing example to be executed by the substrate processing apparatus 1. Hereinafter, a processing example when processing a substrate W having a pattern (refer to FIG. 7A and FIG. 7B) formed on its front surface being a device forming surface is described. The steps described below are executed by controlling the substrate processing apparatus 1 by the controller 3 according to a recipe 33 (refer to FIG. 5).

The second processing example is different from the first processing example in that the second processing example further includes a second solvent replacing step (Step S11 in FIG. 4) and a second hydrophobizing step (Step S12 in FIG. 4). Therefore, hereinafter, the second solvent replacing step and the second hydrophobizing step are described, and description of other steps is omitted.

After the first hydrophobizing step (Step S4 in FIG. 4) is executed, the second solvent replacing step of supplying a solvent (liquid) to the upper surface of the substrate W is executed (Step S11 in FIG. 4).

In detail, in a state where the shield plate 8 is at the processing position, the controller 3 opens the solvent valve 28 and causes the central nozzle 19 to discharge the solvent toward the upper surface central portion of the substrate W being rotated. Accordingly, the solvent as a second solvent is supplied to the whole region of the upper surface of the substrate W. Since the solvent is a liquid that can dissolve the hydrophobizing agent, a portion of the hydrophobizing agent on the substrate W is pushed out to the surrounding area of the substrate W by the solvent supplied to the substrate W, and the remaining hydrophobizing agent dissolves in the solvent supplied to the substrate W. The solvent in which the hydrophobizing agent dissolved is pushed out to the surrounding area of the substrate W by the solvent supplied subsequently to the substrate W. Therefore, by continuing supply of the solvent, all or almost all of the hydrophobizing agent is removed from the substrate W, and the liquid film of the hydrophobizing agent is replaced with a liquid film of the solvent covering the whole region of the upper surface of the substrate W. When a predetermined time elapses after the solvent valve 28 is opened, the controller 3 closes the solvent valve 28 to stop discharge of the solvent.

Next, the second hydrophobizing step of supplying a second hydrophobizing agent (liquid) to the upper surface of the substrate W is executed (Step S12 in FIG. 4).

In detail, the controller 3 opens the hydrophobizing agent valve in a state where the shield plate 8 is at the processing position. That is, in the case where the first hydrophobizing agent valve 23 is opened in the first hydrophobizing step (Step S4 in FIG. 4), the controller 3 opens the second hydrophobizing agent valve 26, and in the case where the second hydrophobizing agent valve 26 is opened in the first hydrophobizing step (Step S4 in FIG. 3), the controller 3 opens the first hydrophobizing agent valve 23. Therefore, a hydrophobizing agent of a kind different from the kind of the hydrophobizing agent supplied to the substrate W in the first hydrophobizing step (Step S4 in FIG. 4) is discharged from the central nozzle 19 toward the upper surface central portion of the substrate W being rotated, and supplied to the whole region of the upper surface of the substrate W. Since the solvent is a liquid that can dissolve the hydrophobizing agent, by continuing supply of the hydrophobizing agent, all or almost all of the solvent is evacuated from the substrate W, and the liquid film of the solvent is replaced with a liquid film of the hydrophobizing agent covering the whole region of the upper surface of the substrate W. Accordingly, the hydrophobizing agent enters the inside of the pattern, and the upper surface of the substrate W is hydrophobized. When a predetermined time elapses after the hydrophobizing agent valve is opened, the controller 3 closes the hydrophobizing agent valve to stop discharge of the hydrophobizing agent. Thereafter, the pre-drying rinsing step (Step S5 in FIG. 4) and the heating step (Step S6 in FIG. 4) are executed.

Figure 5:
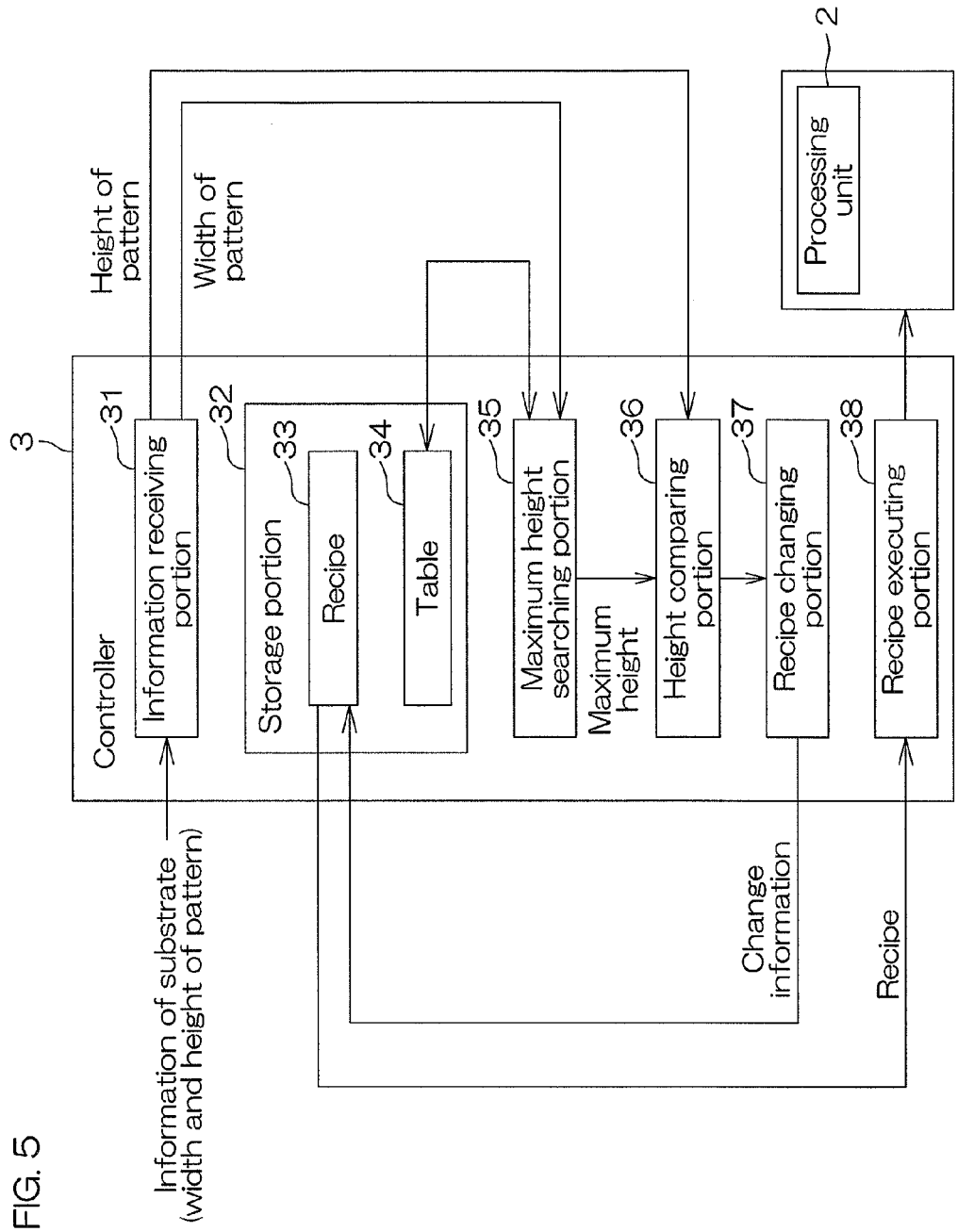
FIG. 5 is a block diagram for describing an electrical configuration of the substrate processing apparatus.
Figure 6:
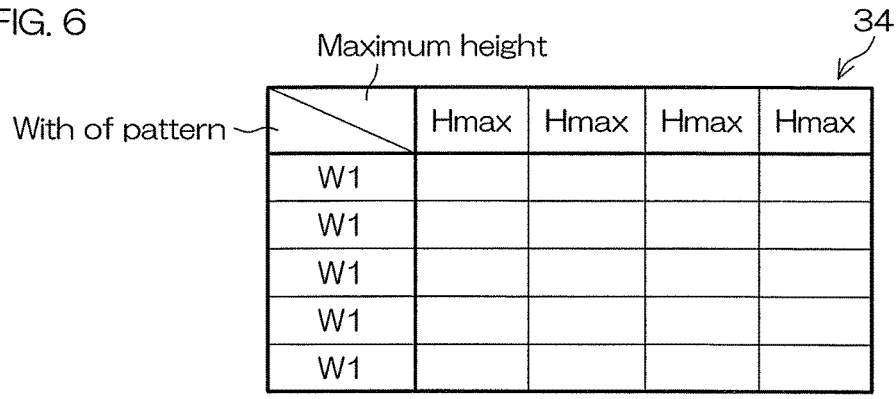
FIG. 6 is a diagram showing a table stored in a controller.
Figure 7A:
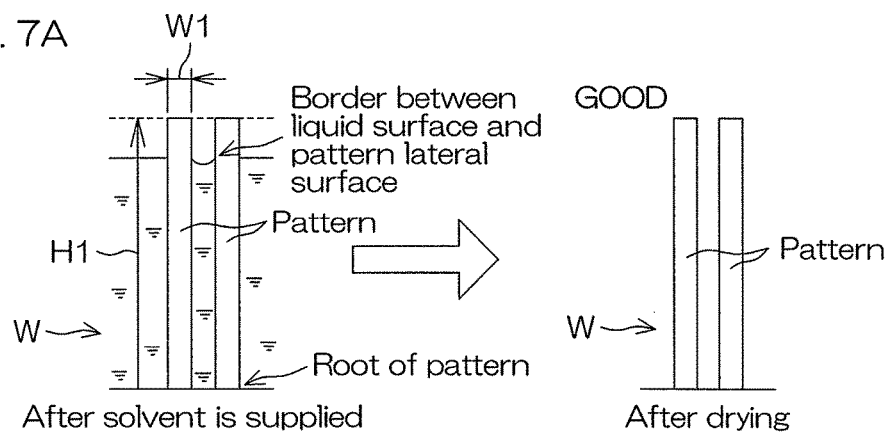
FIG. 7A is a schematic view showing states of a pattern before and after drying the substrate, in a case where a height of the pattern is a maximum height (maximum value of the height when pattern collapse does not occur).
Figure 7B:
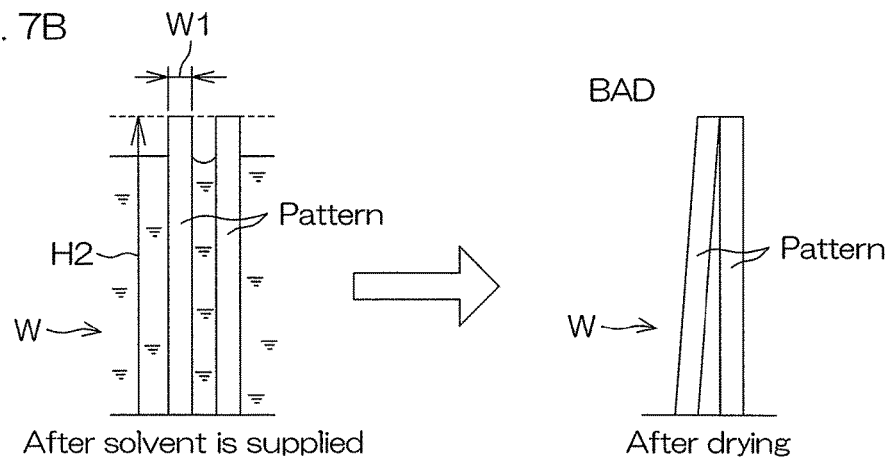
FIG. 7B is a schematic view showing states of the pattern before and after drying the substrate, in a case where a height of the pattern is greater than the maximum height.

FIG. 5 is a block diagram for describing an electrical configuration of the substrate processing apparatus 1. FIG. 6 is a diagram showing a table 34 stored in the controller 3. FIG. 7A and FIG. 7B are schematic views showing states of the pattern before and after drying the substrate W. FIG. 7A shows a case where the height H1 of the pattern is a maximum height Hmax (maximum value when pattern collapse does not occur), and FIG. 7B shows a case where the height H2 of the pattern is greater than the maximum height Hmax.

The controller 3 is a computer including a CPU (Central Processing Unit) and a storage device. As shown in FIG. 5, the controller 3 includes an information receiving portion 31 into which various information is input, and a storage portion 32 in which information such as programs, etc., is stored. Information to be input into the information receiving portion 31 may be transmitted from an external device such as a host computer, or may be input into the information receiving portion 31 via an input device included in the substrate processing apparatus 1. Information of the substrate W including the width W1 and the height H of the pattern is input into the information receiving portion 31. In the storage portion 32, the recipe 33 showing processing conditions for the substrate W and the table 34 showing the relationship between the width W1 and the maximum height Hmax of the pattern are stored.

As shown in FIG. 6, the table 34 contains a plurality of widths W1 different from each other, and a plurality of maximum heights Hmax corresponding to the plurality of widths W1, respectively. The plurality of maximum heights Hmax are measured values that were obtained by changing a width W1 and a height H of a pattern to multiple values in the processing in which a solvent was supplied to a substrate W with the pattern formed on its front surface, and then the substrate W was dried. Each of the maximum heights Hmax is a maximum value of a height H of a pattern having a particular width W1 when pattern collapse does not occur. As long as the conditions other than the height are the same and the height H of the pattern is equal to or smaller than the maximum height Hmax corresponding to the width W1 of the pattern, pattern collapse does not occur when the substrate W supplied with the solvent is dried.

The height H1 of the pattern shown in FIG. 7A is a maximum height Hmax corresponding the width W1 of the pattern, and pattern collapse does not occur. On the other hand, the height H2 of the pattern shown in FIG. 7B is greater than the maximum height Hmax (height H1) corresponding to the width W1 of the pattern, and pattern collapse occurs. The table 34 is an aggregate of collected data of the height H1 of the pattern shown in FIG. 7A and the width W1 of this pattern.

Even if the width W1 and the height H of the pattern are the same, when the material of the pattern and the pattern forming method differ, the strength of the pattern changes. For example, even if the width W1 and the height H of the pattern are the same, the strength of the pattern may differ between when the pattern is a single layer film and when the pattern is a laminated film. Therefore, the maximum height Hmax is preferably a value measured by using a pattern with the lowest strength.

As shown in FIG. 5, the controller 3 includes a maximum height searching portion 35 that searches for a maximum height Hmax corresponding to the width W1 of the pattern input into the information receiving portion 31 from the table 34 stored in the storage portion 32, and a height comparing portion 36 that determines whether or not the height H of the pattern input into the information receiving portion 31 is greater than the maximum height Hmax found by the maximum height searching portion 35. The controller 3 further includes a recipe changing portion 37 that changes the recipe 33 stored in the storage portion 32 when the height H of the pattern is greater than the maximum height Hmax, and a recipe executing portion 38 that causes the substrate processing apparatus 1 to process the substrate W based on conditions designated in the recipe 33 stored in the storage portion 32. The maximum height searching portion 35, etc., are functional blocks realized by executing programs installed in the controller 3 by the controller 3.

Figure 8:
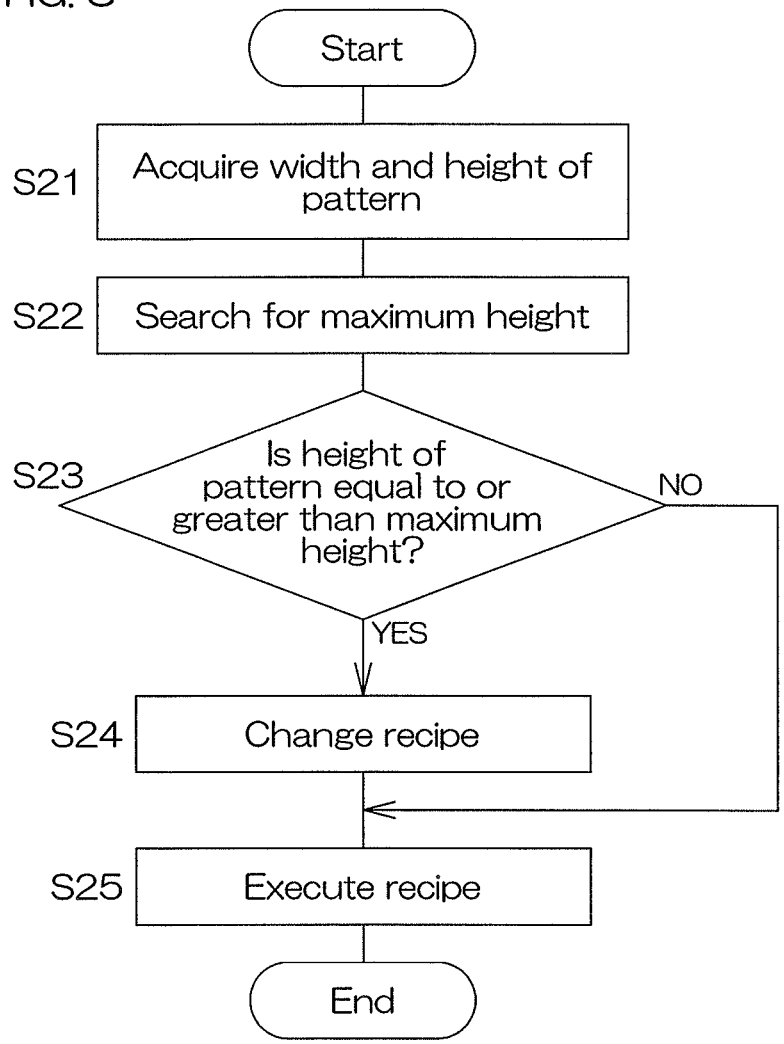
FIG. 8 is a flowchart when determining whether or not a height of a pattern is greater than a maximum height (maximum value of the height when pattern collapse does not occur).

FIG. 8 is a flowchart when determining whether or not a height H of a pattern is greater than a maximum height Hmax.

A width W1 and a height H of a pattern formed on a front surface of a substrate W to be processed are input into the information receiving portion 31 before processing of the substrate W such as the first and second processing, examples is started (Step S21 shown in FIG. 8). The maximum height searching portion 35 searches for a maximum height Hmax corresponding to the width W1 of the pattern input into the information receiving portion 31 from the table 34 stored in the storage portion 32 (Step S22 shown in FIG. 8). The height comparing portion 36 determines whether or not the height H of the pattern input into the information receiving portion 31 is greater than the maximum height Hmax found by the maximum height searching portion 35 (Step S23 shown in FIG. 8).

Figure 9:
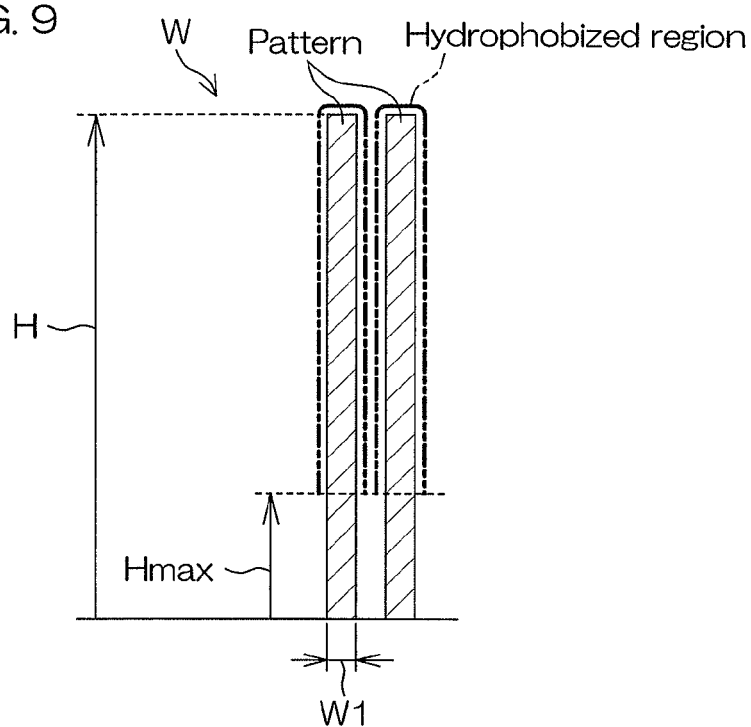
FIG. 9 is a schematic view showing a state of the pattern after a hydrophobizing agent is supplied to the substrate.

When the height H of the pattern is greater than the maximum height Hmax (YES in Step S23 shown in FIG. 8), as shown in FIG. 9, etc., the recipe changing portion 37 changes the recipe 33 such that a hydrophobized region is formed on a whole region on a tip-side of the pattern beyond the maximum height Hmax in a lateral surface of the pattern, and a non-hydrophobized region remains on at least a portion of a region from a root of the pattern to the maximum height Hmax in the lateral surface of the pattern (Step S24 shown in FIG. 8). Then, by controlling the processing unit 2, etc., according to the recipe 33 changed by the recipe changing portion 37, the recipe executing portion 38 causes the substrate processing apparatus 1 to execute processing of the substrate W such as the first and second processing examples, etc., (Step S25 shown in FIG. 8).

FIG. 8 shows an example in which the existing recipe 33 is executed without changing recipe 33 when the height H of the pattern is equal to or smaller than the maximum height Hmax (No in Step S23 shown in FIG. 8). However, when the height H of the pattern is equal to or smaller than the maximum height Hmax, since the height H of the pattern is small, pattern collapse may not occur during drying of the substrate W even if the hydrophobizing agent is not supplied to the substrate W. Therefore, in this case, the recipe changing portion 37 may change the recipe 33 such that Steps S4 to S6 shown in FIG. 3 or Steps S4, S5, S6, S11, and S12 shown in FIG. 4 are not executed. According to this, a processing time of the substrate W and an amount of consumption of the hydrophobizing agent, etc., can be significantly reduced.

Figure 10:
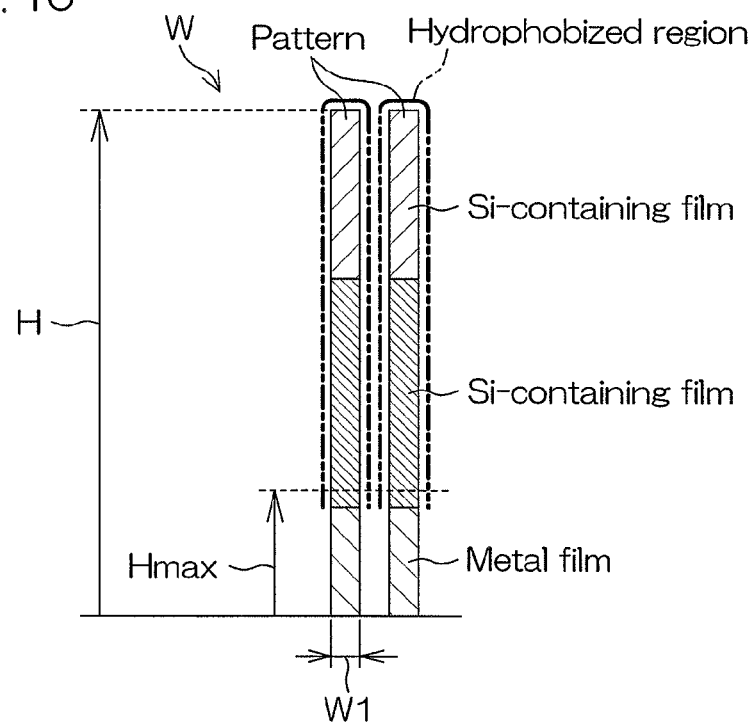
FIG. 10 is a schematic view showing a state of the pattern after a hydrophobizing agent is supplied, to the substrate.
Figure 11:
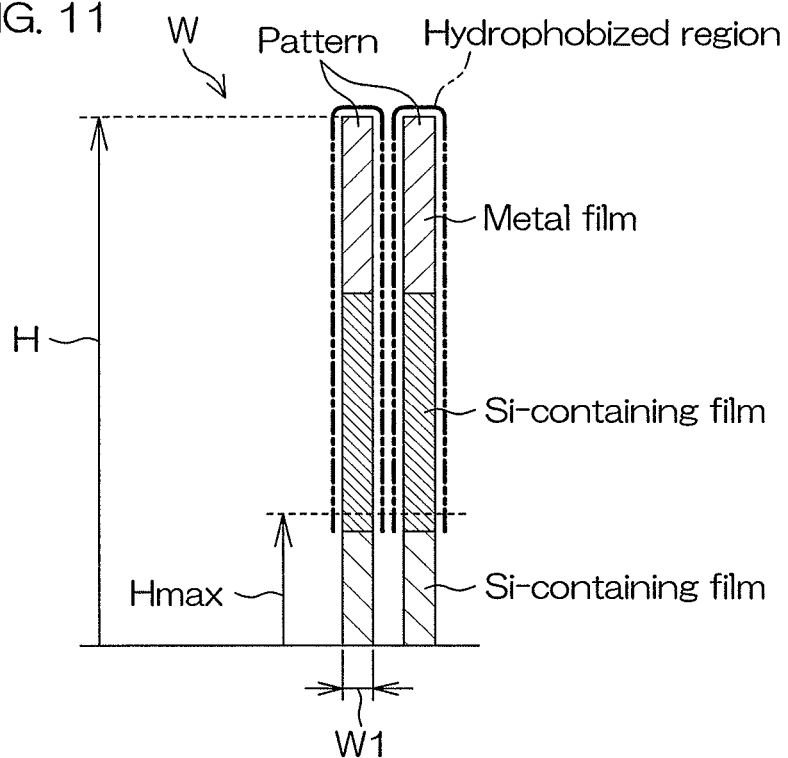
FIG. 11 is a schematic view showing a state of the pattern after a hydrophobizing agent is supplied to the substrate.

FIG. 9 to FIG. 11 are schematic views showing states of the pattern after a hydrophobizing agent is supplied to the substrate W. In FIG. 9 to FIG. 11, ranges of hydrophobized regions formed by supply of the hydrophobizing agent are indicated by thick alternate long and two short dash lines. In each of FIG. 9 to FIG. 11, the height H of the pattern is greater than the width W1 of the pattern.

The "Si-containing film" shown in FIG. 10 and FIG. 11 is any of, for example, a polysilicon film, an $SiO_2$ film, an SiN film, a BSG film ($SiO_2$ film containing boron), and a TEOS film ($SiO_2$ film formed by CVD using TEOS (tetraethoxysilane)). The $SiO_2$ film, BSG film, and TEOS film are oxide films as well. The "metal film" shown in FIG. 10 and FIG. 11 is a film containing at least one of, for example, Ti, W, Cu, and Al. The metal film is, for example, either of a TiN film and a W film.

When the height H of the pattern is greater than the maximum height Hmax (Yes in Step S23 shown in FIG. 8), the recipe changing portion 37 changes at least one of the plurality of conditions including the supply flow rate of the hydrophobizing agent, the supply time of the hydrophobizing agent, and the kind of the hydrophobizing agent designated in the recipe 33 such that a hydrophobized region is formed on the whole of a region on a tip-side of a lateral surface of the pattern, and a non-hydrophobized region remains on at least a portion of a region on a root side of the lateral surface of the pattern.

FIG. 9 shows an example in which the pattern is a single layer film, and a height H of the pattern is greater than a maximum height Hmax corresponding to a width W1 of the pattern. When processing a substrate W on which this pattern is formed, the recipe changing portion 37 reduces at least one of the supply flow rate and the supply time of the hydrophobizing agent designated in the recipe 33. In the recipe 33 before being changed, a supply flow rate and a supply time of the hydrophobizing agent at which the whole region of a lateral surface of the pattern is hydrophobized are designated. Normally, a liquid between two patterns adjacent to each other is replaced from its upper portion with the hydrophobizing agent. Therefore, when at least one of the supply flow rate and the supply time is reduced, the hydrophobizing agent is hardly sufficiently supplied up to the root of the pattern. Therefore, when the recipe executing portion 38 executes the changed recipe 33, a hydrophobized region is formed on a whole region on a tip-side of the pattern beyond the maximum height Hmax in a lateral surface of the pattern, and a non-hydrophobized region remains on at least a portion of a region from the root of the pattern to the maximum height Hmax in the lateral surface of the pattern.

FIG. 10 shows an example in which the pattern has a three-layer structure, an upper layer film, an intermediate layer film, and a lower layer film of the pattern are an Si-containing film, an Si-containing film, and a metal film, respectively, and a maximum height Hmax is within the range of the intermediate layer film. When processing a substrate W on which this pattern is formed, the recipe changing portion 37 changes the recipe 33 such that a silicon hydrophobizing agent that hydrophobizes silicon itself and a compound containing silicon is supplied to the substrate W in the first processing example, and the recipe executing portion 38 causes the substrate processing apparatus 1 to execute the first processing example by controlling the substrate processing apparatus 1 according to the changed recipe 33. Accordingly, a hydrophobized region is formed on the upper layer film and the intermediate layer film, and a non-hydrophobized region remains on the lower layer film.

FIG. 11 shows an example in which the pattern has a three-layer structure, an upper layer film, an intermediate layer film, and a lower layer film of the pattern are a metal film, an Si-containing film, and an Si-containing film, respectively, and a maximum height Hmax is within the range of the intermediate layer film. When processing a substrate W on which this pattern is formed, the recipe changing portion 37 changes the recipe 33 such that a silicon hydrophobizing agent is supplied to the substrate W in the first hydrophobizing step (Step S4 shown in FIG. 4) of the second processing example, and a metal hydrophobizing agent that hydrophobizes a metal itself and a compound containing a metal is supplied to the substrate W in the second hydrophobizing step (Step S12 shown in FIG. 4) of the second processing example. Further, the recipe changing portion 37 reduces a supply flow rate and a supply time of the silicon hydrophobizing agent such that a non-hydrophobized region remains on the lower layer film. The recipe executing portion 38 causes the substrate processing apparatus 1 to execute the second processing example by controlling the substrate processing apparatus 1 according to the changed recipe 33. Accordingly, a hydrophobized region is formed on the upper layer film and the intermediate layer film, and a non-hydrophobized region remains on the lower layer film.

As described above, in the present preferred embodiment, with respect to a plurality of pattern widths W1 different from each other, maximum values (maximum heights Hmax) of the pattern height H when pattern collapse does not occur are measured in advance. When a width W1 of a pattern formed on a front surface of a substrate W to be processed is known, a corresponding maximum height Hmax is searched. Then, when the corresponding maximum height Hmax is found, whether or not the height H of the pattern is greater than this maximum height Hmax is determined. When the height H of the pattern is greater than the maximum height Hmax, a hydrophobizing agent that hydrophobizes the substrate W is supplied to the substrate W. Accordingly, a hydrophobized region is formed on a whole region on a tip-side of the pattern beyond the maximum height Hmax in a lateral surface of the pattern, and a non-hydrophobized region remains on a portion or whole of a region from a root of the pattern to the maximum height Hmax in the lateral surface of the pattern. That is, the region on the tip-side beyond the maximum height Hmax is hydrophobized, however, the region from the root of the pattern to the maximum height Hmax is not hydrophobized or only partly hydrophobized.

After the hydrophobizing agent is supplied to the substrate W, a solvent lower in surface tension than water is supplied to the substrate W, and the hydrophobizing agent held by the substrate W is replaced with the solvent. Thereafter, the solvent is removed from the substrate W, and the substrate W is dried. At this time, the liquid surface of the solvent moves from the tip of the pattern toward the root of the pattern. As described above, since the region on the tip-side beyond the maximum height Hmax is hydrophobized, when the border between the surface of the solvent and the lateral surface of the pattern is in this region, a force that is generated at the border is small, and pattern collapse hardly occurs. Although the region from the root of the pattern to the maximum height Hmax is not sufficiently hydrophobized, when the border between the surface of the solvent and the lateral surface of the pattern is in this region, the distance from the point of effort (the border) to the point of application (the root of the pattern) is small, so that the moment to be applied to the pattern is small. Therefore, pattern collapse hardly occurs.

Thus, in the present preferred embodiment, since a whole region on a tip-side of the pattern beyond the maximum height Hmax in a lateral surface of the pattern is hydrophobized, occurrence of pattern collapse can be suppressed or prevented. Further, since a non-hydrophobized region is left in a region from a root of the pattern to the maximum height Hmax in the lateral surface of the pattern, as compared with the case where the whole region of the lateral surface of the pattern is hydrophobized, at least one of a supply flow rate and a supply time of the hydrophobizing agent can be reduced. Accordingly, the substrate W can be dried while occurrence of pattern collapse is suppressed or prevented, and at least one of the supply flow rate and the supply time of the hydrophobizing agent can be reduced.

In addition, in the present preferred embodiment, a hydrophobizing agent and a solvent are supplied in this order to the substrate W, and the solvent held by the substrate W is heated (the heating step shown in FIG. 3 and FIG. 4). Since the temperature of the solvent rises due to heating, the hydrophobizing agent can be efficiently replaced with the solvent, and the time to replace the hydrophobizing agent with the solvent can be shortened. Further, vaporization of the solvent is promoted during drying of the substrate W, and the drying time of the substrate W is shortened. Further, since vaporization of the solvent is promoted, the film thickness of the solvent before drying of the substrate W is started decreases. Accordingly, since the amount of the solvent that should be removed from the substrate W decreases, the drying time of the substrate W can be further shortened. In addition, due to the temperature rise, the surface tension of the solvent decreases, so that a force to be applied to the pattern during drying of the substrate W can be further reduced.

Figure 12:
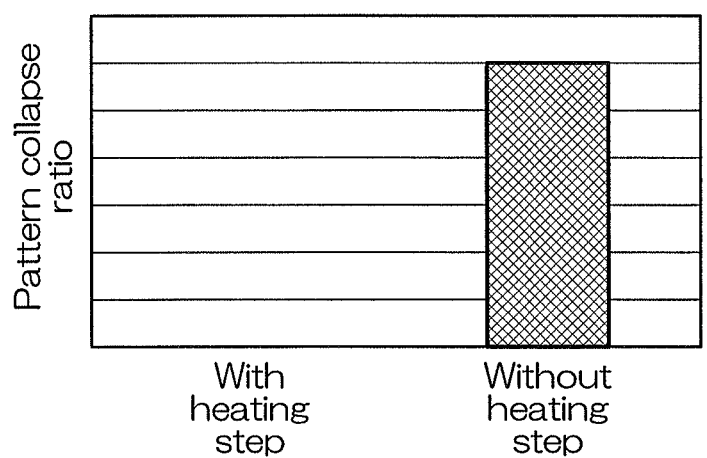
FIG. 12 is a graph showing pattern collapse ratios in a case where all of the steps shown in FIG. 3 including a heating step are executed, and in a case where all of the steps shown in FIG. 3 except for a heating step are executed.

FIG. 12 shows pattern collapse ratios when all of the steps shown in FIG. 3 including the heating step are executed and when all of the steps shown in FIG. 3 except for the heating step are executed. A pattern collapse ratio is a ratio of the number of patterns that collapsed to a total number of patterns formed on the front surface of the substrate W. The measurement conditions differ only in whether the heating step is executed, and other measurement conditions are the same. As shown on the right side in FIG. 12, when the heating step was not executed, pattern collapse occurred. On the other hand, as shown on the left side in FIG. 12, when the heating step was executed, the pattern collapse ratio was zero, and the pattern collapse ratio was lower than in the case where the heating step was not executed. Therefore, by executing the heating step (Step S6 shown in FIG. 3 and FIG. 4) in parallel to the pre-drying rinsing step (Step S5 shown in FIG. 3 and FIG. 4), the pattern collapse ratio can be decreased.

In the present preferred embodiment, during a period from an end of supply of a hydrophobizing agent to the substrate W to an end of drying of the substrate W, water (liquid containing water as a main component) is not supplied to the substrate W. Therefore, during this period, a state where water does not contact the substrate W is maintained. When water comes into contact with the substrate W hydrophobized by a hydrophobizing agent (metal hydrophobizing agent) that hydrophobizes a metal film, the hydrophobic property of the substrate W may significantly deteriorate. Therefore, even when such a hydrophobizing agent is supplied to a substrate W, the hydrophobic property of the substrate W can be prevented from significantly deteriorating. Accordingly, occurrence of pattern collapse can be suppressed or prevented.

The present invention is not limited to the contents of the above-described preferred embodiment, but may be variously modified within the scope of the present invention.

For example, in the above preferred embodiment, a maximum height being a maximum value of a pattern height when pattern collapse does not occur in a pattern width of a pattern formed on a front surface of a substrate is predicted. However, a threshold value of a pattern height does not necessarily have to be accurately predicted. The threshold value means a value in which the possibility of occurrence of pattern collapse greatly increases, if a height of a pattern exceeds the value.

For example, a pattern height with which pattern collapse is less likely to occur is grasped empirically. By hydrophobizing a whole region on a tip-side of the pattern beyond this pattern height, pattern collapse can be prevented.

For example, as described above, in the case of a pattern having a three-layer structure consisting of an upper layer film, an intermediate layer film, and a lower layer film shown in FIG. 10 and FIG. 11, it is empirically known that a maximum height Hmax is positioned within the range of the intermediate layer film. In this case, the value of the maximum height Hmax does not needs to be accurately grasped. Therefore, it is unnecessary to execute Steps S22 and S23 shown in FIG. 8.

When it can be determined that a pattern having a three-layer structure is formed on a substrate to be processed, a hydrophobizing step is executed such that a hydrophobized film is formed on lateral surfaces of the upper layer film and the intermediate layer film, and a hydrophobized film is not formed on a portion of a lateral surface of the lower layer film. In this case, pattern collapse can also be prevented. In addition, it is not necessary to hydrophobize the whole lateral surface of the pattern, so that an amount of a hydrophobizing agent and a processing time to be required for hydrophobizing can be reduced.

The case where a solvent on a substrate W is heated by using hot water (heating liquid) discharged from the heating nozzle 11 is described above, however, in addition to or instead of the heating liquid, a gas (heating gas) at a temperature higher than a room temperature may be used to heat the solvent on the substrate W. For example, the heating nozzle 11 may be caused to discharge a high-temperature nitrogen gas or clean air instead of hot water. Additionally, in addition to or instead of the heating fluid (heating liquid and heating gas), an infrared lamp or a hot plate may be used to heat the solvent on the substrate W.

The case where the heating step of heating a solvent on a substrate W is executed in parallel to the pre-drying rinsing step is described above, however, the heating step may be omitted.

The case where the central nozzle 19 is caused to discharge a solvent at a room temperature in the pre-drying rinsing step is described above, however, the central nozzle 19 may be caused to discharge a solvent at a temperature higher than a room temperature. For example, a heater that heats a solvent to be supplied from the solvent piping 27 to the processing liquid piping 20 may be provided.

The case where a hydrophobizing agent on a substrate W is replaced with a solvent in the pre-drying rinsing step is described above, however, it is also possible that a hydrophobizing agent on a substrate W is replaced with a rinse liquid such as pure water, and then, the rinse liquid on the substrate W is replaced with a solvent. That is, before the pre-drying rinsing step after the hydrophobizing step (first or second hydrophobizing step), a water rinsing step may be executed.

The case where a liquid of a hydrophobizing agent discharged from the central nozzle 19 is supplied to a substrate W is described above, however, vapor, mist, or shower of a hydrophobizing agent may be discharged from the central nozzle 19. Similarly, the case where a liquid of a solvent discharged from the central nozzle 19 is supplied to a substrate W is described above, however, vapor or mist of a solvent may be discharged from the central nozzle 19.

The case where the hydrophobizing agents, the solvent, and the pure water are discharged from the same nozzle (central nozzle 19) is described above, however, the hydrophobizing agents, the solvent, and the pure water may be discharged from separate nozzles. The nozzle that discharges the hydrophobizing agents, the solvent, and the pure water is not limited to a nozzle fixed to the shield plate 8, but may be a nozzle capable of scanning a front surface of a substrate W, like the chemical nozzle 15.

The case where the substrate processing apparatus 1 is an apparatus that processes a disk-shaped substrate is described above, however, the substrate processing apparatus 1 may be an apparatus that processes a rectangular substrate.

The case where the substrate processing apparatus 1 is a single substrate processing type apparatus is described above, however, the substrate processing apparatus 1 may be a batch type apparatus that processes a plurality of substrates in a batch.

Two or more of any of the arrangements described above may be combined.

The present application corresponds to Japanese Patent Application No. 2014-201719 filed on Sep. 30, 2014 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
 an information receiving step of receiving a width and a height of a pattern formed on a front surface of a substrate;
 a maximum height searching step of searching for a maximum height, that corresponds to the received width of the pattern formed on the front surface of the substrate to be processed, among a plurality of maximum heights each being a maximum value of a height of a pattern having a particular width when pattern collapse does not occur;
 a height comparing step of determining whether or not the received height of the pattern formed on the front surface of the substrate is greater than the maximum height found in the maximum height searching step;
 a hydrophobizing step of supplying, in a case where the height of the pattern is greater than the maximum height, a hydrophobizing agent to the substrate such that a hydrophobized region is formed on a whole tip-side region that is a region other than a root-side region from a root of the pattern to the maximum height in a lateral surface of the pattern, and a non-hydrophobized region remains on at least a portion of the root-side region in the lateral surface of the pattern;

a pre-drying rinsing step of replacing the hydrophobizing agent held by the substrate with a solvent lower in surface tension than water by supplying the solvent to the substrate, after the hydrophobizing step; and a drying step of drying the substrate by removing the solvent held by the substrate, after the pre-drying rinsing step.

2. The substrate processing method according to claim 1, further comprising a heating step of heating the solvent held by the substrate while discharging the solvent toward the substrate in the pre-drying rinsing step.

3. The substrate processing method according to claim 1, wherein the hydrophobizing step includes a step of making, in a case where the height of the pattern is greater than the maximum height, at least one of a supply flow rate and a supply time of the hydrophobizing agent to be supplied to the substrate smaller than a supply flow rate and a supply time of the hydrophobizing agent at which the hydrophobized region is formed on the whole region of the lateral surface of the pattern.

4. The substrate processing method according to claim 1, wherein the hydrophobizing step includes a step of supplying, in a case where the pattern is a laminated film and the height of the pattern is greater than the maximum height, the substrate with a hydrophobizing agent that hydrophobizes at least one film constituting the tip-side region in the lateral surface of the pattern.

5. The substrate processing method according to claim 1, further comprising a non-contacting step of maintaining a state where water does not contact the substrate during a period from an end of the hydrophobizing step to an end of the drying step.

6. The substrate processing method according to claim 1, wherein
the substrate processing method further includes a recipe changing step of changing, in a case where the height of the pattern is greater than the maximum height, a recipe for processing conditions for the substrate based on the maximum height searched in the maximum height searching step such that the hydrophobized region is formed on the whole tip-side region and the non-hydrophobized region remains on at least a portion of the root-side region, and
the hydrophobizing step is a step of supplying, in a case where the height of the pattern is greater than the maximum height, the hydrophobizing agent to the substrate in accordance with the processing conditions changed in the recipe changing step.

7. The substrate processing method according to claim 6, wherein said information receiving step, and maximum height searching step said height comparing step are carried out by a controller, and wherein said recipe is stored in a storage in said controller.

8. The substrate processing method according to claim 7, wherein said recipe changing step is carried out by said controller.

9. The substrate processing method according to claim 1, wherein said information receiving step, said maximum height searching step and said height comparing step are carried out by a controller.

10. The substrate processing method according to claim 9, wherein said received width and height are supplied respectively to a maximum height searching portion and a height comparing portion in said controller.

11. The substrate processing method according to claim 10, wherein said maximum height searching portion provides a maximum height to said height comparing portion.

12. The substrate processing method according to claim 11, wherein said maximum height searching portion exchanges width and height information with a table stored in a storage in said controller.

13. The substrate processing method according to claim 10, wherein said maximum height searching portion exchanges width and height information with a table stored in a storage in said controller.

14. A substrate processing method comprising:
an information receiving step of receiving a width and a height of a pattern formed on a front surface of a substrate;
an identifying step of identifying a pattern height with which pattern collapse does not occur in the received width of the pattern formed on the front surface of the substrate to be processed;
a hydrophobizing step of supplying a hydrophobizing agent to the substrate such that a hydrophobized region is formed on a whole tip-side region that is a region other than a root-side region from a root of the pattern to the pattern height in a lateral surface of the pattern and a non-hydrophobized region remains on at least a portion of the root-side region in the lateral surface of the pattern;
a pre-drying rinsing step of replacing the hydrophobizing agent held by the substrate with a solvent lower in surface tension than water by supplying the solvent to the substrate, after the hydrophobizing step; and
a drying step of drying the substrate by removing the solvent held by the substrate, after the pre-drying rinsing step.

15. The substrate processing method according to claim 14, wherein
the pattern is a laminated pattern including an upper layer film, an intermediate layer film, and a lower layer film,
the identifying step of identifying the pattern height is a step of identifying a height of the intermediate layer film as the pattern height, and
the hydrophobizing step is a step of supplying the hydrophobizing agent to the substrate such that the hydrophobized region is formed on lateral surfaces of the upper layer film and the intermediate layer film, and the non-hydrophobized region remains on at least a portion of a lateral surface of the lower layer film.

16. The substrate processing method according to claim 14, wherein
the substrate processing method further includes a recipe changing step of changing a recipe for processing conditions for the substrate based on the pattern height identified in the identifying step such that the hydrophobized region is formed on the whole tip-side region and the non-hydrophobized region remains on at least a portion of the root-side region, and
the hydrophobizing step is a step of supplying the hydrophobizing agent to the substrate in accordance with the processing conditions changed in the recipe changing step.

17. The substrate processing method according to claim 16, wherein said information receiving step, and maximum height searching step said height comparing step are carried out by a controller, and wherein said recipe is stored in a storage in said controller.

18. The substrate processing method according to claim 17, wherein said recipe changing step is carried out by said controller.

\* \* \* \* \*